United States Patent
Lin et al.

(10) Patent No.: US 10,079,257 B2
(45) Date of Patent: Sep. 18, 2018

(54) ANTI-REFLECTIVE LAYER FOR BACKSIDE ILLUMINATED CMOS IMAGE SENSORS

(71) Applicant: TAIWAN SEMICONDUCTOR MANUFACTURING CO., LTD., Hsin-Chu (TW)

(72) Inventors: Hsing-Lien Lin, Hsinchu (TW); Yeur-Luen Tu, Taichung (TW); Cheng-Yuan Tsai, Chu-Pei (TW); Cheng-Ta Wu, Shueishang Township (TW); Chia-Shiung Tsai, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/755,376

(22) Filed: Jan. 31, 2013

(65) Prior Publication Data

US 2013/0270663 A1  Oct. 17, 2013

Related U.S. Application Data

(60) Provisional application No. 61/624,109, filed on Apr. 13, 2012.

(51) Int. Cl.
*H01L 31/0216* (2014.01)
*H01L 27/146* (2006.01)

(52) U.S. Cl.
CPC .... *H01L 27/14625* (2013.01); *H01L 27/1462* (2013.01); *H01L 27/1464* (2013.01);
(Continued)

(58) Field of Classification Search
CPC ...... G02B 1/11; G02B 1/115; H01L 31/02168
See application file for complete search history.

(56) References Cited

U.S. PATENT DOCUMENTS

| | | | | |
|---|---|---|---|---|
| 3,738,732 A | * | 6/1973 | Ikeda | G02B 1/115 359/588 |
| 2006/0177638 A1 | * | 8/2006 | Shibuya | C23C 14/0021 428/212 |

(Continued)

FOREIGN PATENT DOCUMENTS

| CN | 101079967 A | 11/2007 |
|---|---|---|
| CN | 102386194 | 3/2012 |

(Continued)

OTHER PUBLICATIONS

S. I. Park and Y. J. Lee, "Design of Multilayer Antireflection Coatings," May 1998, Journal of the Korean Physical Society, vol. 32, No. 5, pp. 676-280.*

(Continued)

*Primary Examiner* — Matthew Landau
*Assistant Examiner* — Mark Hatzilambrou
(74) *Attorney, Agent, or Firm* — Eschweiler & Potashnik, LLC

(57) ABSTRACT

A method of forming an image sensor device includes forming a light sensing region at a front surface of a silicon substrate and a patterned metal layer there over. Thereafter, the method includes depositing a metal oxide anti-reflection laminate on the first surface of the substrate. The metal oxide anti-reflection laminate includes one or more composite layers of thin metal oxides stacked over the photodiode. Each composite layer includes two or more metal oxide layers: one metal oxide is a high energy band gap metal oxide and another metal oxide is a high refractive index metal oxide.

20 Claims, 5 Drawing Sheets

(52) U.S. Cl.
CPC .. *H01L 27/14685* (2013.01); *H01L 31/02168* (2013.01); *H01L 27/14609* (2013.01); *H01L 27/14627* (2013.01)

(56) References Cited

U.S. PATENT DOCUMENTS

| | | | |
|---|---|---|---|
| 2007/0166865 A1* | 7/2007 | Lee | H01L 27/14643 438/57 |
| 2007/0210395 A1* | 9/2007 | Maruyama | H01L 27/14609 257/431 |
| 2008/0158680 A1* | 7/2008 | Taketomo | C23C 14/0042 359/586 |
| 2010/0073764 A1* | 3/2010 | Kai | G02B 5/22 359/359 |
| 2010/0285320 A1* | 11/2010 | Saad | 428/432 |
| 2010/0313875 A1* | 12/2010 | Kennedy | F24J 2/055 126/652 |
| 2011/0031376 A1* | 2/2011 | Oshiyama | H01L 27/14632 250/208.1 |
| 2011/0117345 A1* | 5/2011 | Nishimoto | B32B 7/02 428/216 |
| 2012/0049306 A1* | 3/2012 | Ohba et al. | 257/432 |
| 2012/0067421 A1* | 3/2012 | Shao | H01L 31/022466 136/260 |
| 2012/0154916 A1* | 6/2012 | Nishimoto et al. | 359/580 |
| 2012/0248560 A1* | 10/2012 | Lee et al. | 257/432 |

FOREIGN PATENT DOCUMENTS

| | | |
|---|---|---|
| JP | S63139302 | 6/1988 |
| JP | 2005099513 | 4/2005 |
| JP | 2007258684 | 10/2007 |
| JP | 2009-42278 | 2/2009 |
| JP | 2010186818 | 8/2010 |
| KR | 10-2012-0021197 | 3/2012 |
| TW | 201214688 | 4/2012 |

OTHER PUBLICATIONS

Office Action dated Apr. 9, 2014 and English translation from corresponding application No. KR 10-2013-0040884.
Office Action dated May 25, 2015 from corresponding No. TW 102112989.

\* cited by examiner

ANTI-REFLECTIVE LAYER FOR BACKSIDE ILLUMINATED CMOS IMAGE SENSORS

CROSS-REFERENCE TO RELATED APPLICATION

The present application claims priority of U.S. Provisional Patent Application Ser. No. 61/624,109, filed on Apr. 13, 2012, which is incorporated herein by reference in its entirety.

FIELD

The present disclosure pertains to semiconductor materials and processes, particularly to materials and processes for image sensors.

BACKGROUND

Integrated circuit (IC) technologies are constantly being improved. Such improvements frequently involve scaling down device geometries to achieve lower fabrication costs, higher device integration density, higher speeds, and better performance. Along with the advantages realized from reducing geometry size, improvements are being made directly to the IC devices. One such IC device is an image sensor device. An image sensor device includes a pixel array (or grid) for detecting light and recording an intensity (brightness) of the detected light. The pixel array responds to the light by accumulating a charge—for example, the higher the intensity of the light, the higher the charge accumulated in the pixel array. The accumulated charge is then used (for example, by other circuitry) to provide a color and brightness for use in a suitable application, such as a digital camera.

One type of image sensor device is a backside illuminated (BSI) image sensor device. BSI image sensor devices are used for sensing a volume of light projected towards a backside surface of a substrate (which supports the image sensor circuitry of the BSI image sensor device). The pixel grid is located at a front side of the substrate, and the substrate is thin enough so that light projected towards the backside of the substrate can reach the pixel grid. BSI image sensor devices provide a high fill factor and reduced destructive interference, as compared to front-side illuminated (FSI) image sensor devices. Due to device scaling, improvements to BSI technology are continually being made to further improve image quality of BSI image sensor devices. Although existing BSI image sensor devices and methods of fabricating BSI image sensor devices have been generally adequate for their intended purposes, as device scaling down continues, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
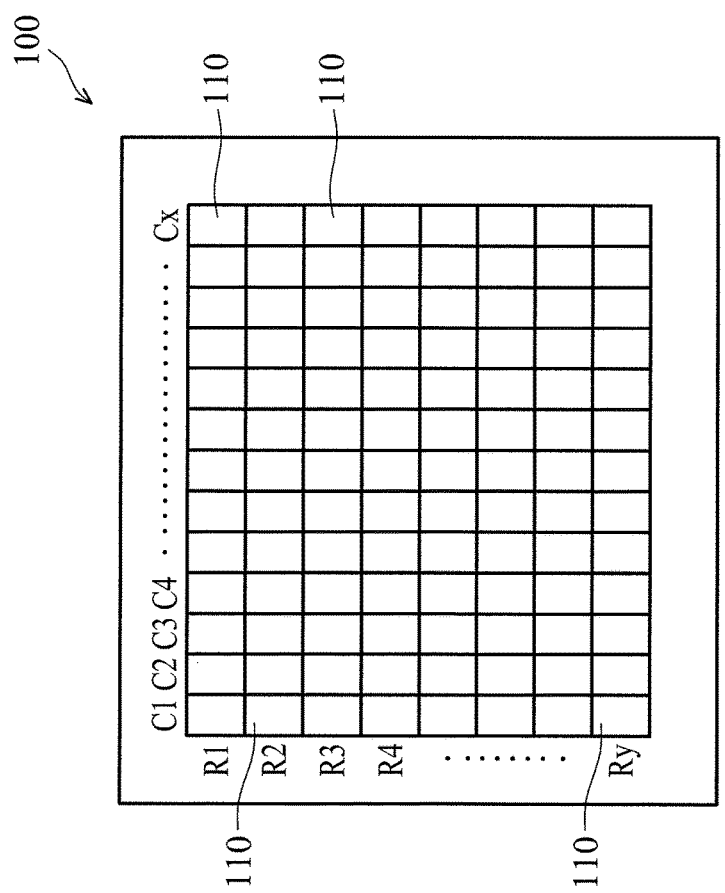
FIG. 1 is a top view of an image sensor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Image sensor designs are improved to maximize quantum efficiency and minimize current leakage while maintaining good structural integrity and manufacturability. According to various embodiments of this disclosure, a novel anti-reflection (AR) film of a metal oxide anti-reflection laminate is used between a photodetector in an image sensor and a light source. In some embodiments, the metal oxide anti-reflection laminate improves quantum efficiency, defined as ratio of number of carriers generated to number of photons incident upon an active region of the image sensor device, because the metal oxide anti-reflection laminate has multiple layers with tunable refractive indices unlike a conventional AR film of silicon carbide, silicon nitride, silicon oxide, silicon oxynitride or combinations of these films. In some embodiments, the metal oxide anti-reflection laminate is less likely to delaminate or peel from adjacent layers because the metal oxide anti-reflection laminate is deposited with intrinsic compressive stress, resulting in improved structural integrity of the layers. In some embodiments, the metal oxide anti-reflection laminate also has a higher energy band gap as compared to conventional AR films. The higher energy band-gap reduces current leakage and likelihood of plasma damage during subsequent processing. Another feature of the metal oxide anti-reflection laminate, according to some embodiments, is that it has an overall negative charge. The negative charge creates a depletion region at or close to an interface that reduces dark current (current that flows in the image sensor device in absence of incident light on the image sensor device) that can cause a white pixel (where an excessive amount of current leakage causes an abnormally high signal from the pixel).

The metal oxide anti-reflection laminate includes one or more composite layers of thin metal oxides stacked over the photodiode. The metal oxide anti-reflection laminate allows light to pass through from a lens to the photodiode while minimizing reflection that would decrease the efficiency of the device. Each composite layer includes two or more metal oxide layers. In the case of a composite layer having two metal oxide layers, the composite layer is a metal oxide pair. One metal oxide is a high energy band gap metal oxide and another metal oxide is a high refractive index metal oxide. In the case of a composite layer having three or more metal oxide layers, at least one metal oxide layer has a high energy band gap metal oxide and at least one metal oxide layer has a high refractive index metal oxide. In some embodiments, the metal oxide layer in the composite layer closest to the photodiode is a high energy band gap metal oxide. In composite layers further away from the photodiode, the metal oxide layers may be in any order.

Figure 2:
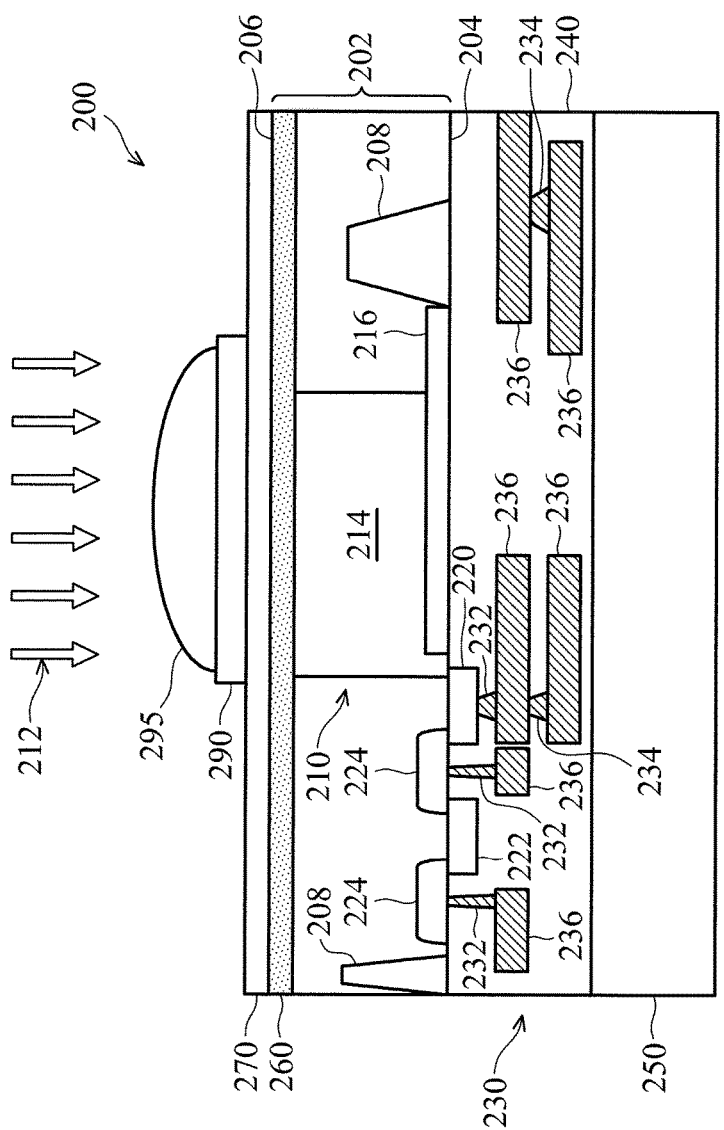
FIG. 2 is a diagrammatic sectional side view of an integrated circuit device including an image sensor device sensor element according to various aspects of the present disclosure.

To provide context for a detailed description of the metal oxide anti-reflection laminate with metal oxide layers, a back side illuminated (BSI) CMOS image sensor (CIS) device in accordance with various embodiments of the present disclosure is discussed in association with FIGS. 1 and 2. FIG. 1 is a top view of an image sensor device 100 according to various aspects of the present disclosure. In the depicted embodiment, the image sensor device is a backside illuminated (BSI) image sensor device. The image sensor device 100 includes an array of pixels 110. Each pixel 110 is arranged into a column (for example, C1 to Cx) and a row (for example, R1 to Ry). The term "pixel" refers to a unit cell containing features (for example, a photodetector and various circuitry, which may include various semiconductor devices) for converting electromagnetic radiation to an electrical signal.

The pixels 110 may include photodiodes, complementary metal-oxide-semiconductor (CMOS) image sensors, charged coupling device (CCD) sensors, active sensors, passive sensors, other sensors, or combinations thereof. As such, the pixels 110 may comprise conventional image sensing devices. The pixels 110 may be designed as having various sensor types. For example, one group of pixels 110 may be CMOS image sensors and another group of pixels 110 may be passive sensors. Moreover, the pixels 110 may include color image sensors and/or monochromatic image sensors. In an example, each pixel 110 is an active pixel sensor, such as a complementary metal-oxide-semiconductor (CMOS) image sensor. In the depicted embodiment, each pixel 110 may include a photodetector, such as a photogate-type photodetector, for recording an intensity or brightness of light (radiation). Each pixel 110 may also include various semiconductor devices, such as various transistors including a transfer transistor, a reset transistor, a source-follower transistor, a select transistor, other suitable transistor, or combinations thereof. Additional circuitry, an input, and/or an output may be coupled to the pixel array to provide an operation environment for the pixels 110 and support external communications with the pixels 110. For example, the pixel array may be coupled with readout circuitry and/or control circuitry. For simplicity, image sensor devices including a single pixel are described in the present disclosure; however, typically an array of such pixels may form the image sensor device 100 illustrated in FIG. 1.

FIG. 2 is a diagrammatic cross-sectional view of an integrated circuit device 200 according to various aspects of the present disclosure. In the depicted embodiment, integrated circuit device 200 includes a backside illuminated (BSI) image sensor device. The integrated circuit device 200 may be an integrated circuit (IC) chip, system on chip (SoC), or portion thereof, that includes various passive and active microelectronic components, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, fin-like field effect transistors (FinFETs), other suitable components, or combinations thereof. FIG. 2 has been simplified for the sake of clarity to better understand the inventive concepts of the present disclosure. Additional features can be added in the integrated circuit device 200, and some of the features described below can be replaced or eliminated for other embodiments of the integrated circuit device 200.

In FIG. 2, the integrated circuit device 200 includes a substrate 202 having a front surface 204 and a back surface 206. In the depicted embodiment, the substrate 202 is a semiconductor substrate including silicon. Alternatively or additionally, the substrate 202 includes another elementary semiconductor, such as germanium and/or diamond; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 202 may be a semiconductor on insulator (SOI). The substrate 202 may include a doped epi layer, a gradient semiconductor layer, and/or a semiconductor layer overlying another semiconductor layer of a different type, such as a silicon layer on a silicon germanium layer. In the depicted embodiment, the substrate 202 is a p-type substrate. P-type dopants that the substrate 202 is doped with include boron, gallium, indium, other suitable p-type dopants, or combinations thereof. Because the depicted integrated circuit device 200 includes a p-type doped substrate, doping configurations described below should be read consistent with a p-type doped substrate. The substrate 202 may alternatively be an n-type doped substrate, in which case, the doping configurations described below should be read consistent with an n-type doped substrate (for example, read with doping configurations having an opposite conductivity). N-type dopants that the substrate 202 can be doped with include phosphorus, arsenic, other suitable n-type dopants, or combinations thereof. The substrate 202 may include various p-type doped regions and/or n-type doped regions. Doping may be implemented using a process such as ion implantation or diffusion in various steps and techniques.

The substrate 202 includes isolation features 208, such as local oxidation of silicon (LOCOS) and/or shallow trench isolation (STI), to separate (or isolate) various regions and/or devices formed on or within the substrate 202. For example, the isolation features 208 isolate a sensor element 210 from adjacent sensor elements. In the depicted embodiment, the isolation features 208 are STIs. The isolation features 208 include silicon oxide, silicon nitride, silicon oxynitride, other insulating material, or combinations thereof. The isolation features 208 are formed by any suitable process. As one example, forming an STI includes a photolithography process, etching a trench in the substrate (such as by using a dry etching, wet etching, or combinations thereof), and filling the trench (for example, by using a chemical vapor deposition process) with one or more dielectric materials. In an example, the filled trench may have a multi-layer structure, such as a thermal oxide liner layer filled with silicon nitride or silicon oxide. In another example, the STI structure may be created using a processing sequence such as: growing a pad oxide, forming a low pressure chemical vapor deposition (LPCVD) nitride layer over the pad oxide, patterning an STI opening in the pad oxide and nitride layer using photoresist and masking, etching a trench in the substrate in the STI opening, optionally growing a thermal oxide trench liner to improve the trench interface, filling the trench with oxide, using chemical mechanical polishing (CMP) processing to etch back and planarize, and using a nitride stripping process to remove the nitride layer.

As noted above, the integrated circuit device 200 includes the sensor element (or sensor pixel) 210. The sensor element 210 detects an intensity (brightness) of radiation, such as incident radiation (light) 212, directed toward the back surface 206 of the substrate 202. The incident radiation is visual light. Alternatively, the radiation 212 is infrared (IR), ultraviolet (UV), x-ray, microwave, other suitable radiation type, or combinations thereof. The sensor element 210 may be configured to correspond to a specific light wavelength, such as a red, a green, or a blue light wavelength. In other words, the sensor element 210 may be configured to detect an intensity (brightness) of a particular wavelength of light. In the depicted embodiment, the sensor element 210 is a pixel, which may be in a pixel array, such as the pixel array illustrated in FIG. 1. In the depicted embodiment, the sensor element 210 includes a photodetector, such as a photodiode, that includes a light-sensing region (or photo-sensing region) 214 and a pinned layer 216. The light-sensing region (or photo-sensing region) 214 is a doped region having n-type and/or p-type dopants formed in the substrate 202, specifically along the front surface 204 of the substrate 202. In the depicted embodiment, the light-sensing region 214 is an n-type doped region. The light-sensing region 214 is formed by a method such as diffusion and/or ion implantation. The pinned layer 216 is a doped layer disposed at the front surface 204 of the substrate 202. For example, in the depicted embodiment, the pinned layer 216 is a p-type implanted layer having a conductivity type opposite to that of the light sensing region. The sensor element 210 further includes various transistors, such as a transfer transistor associated with a transfer gate 220, a reset transistor associated with a reset gate 222, a source-follower transistor (not illustrated), a select transistor (not illustrated), other suitable transistors, or combinations thereof. The light-sensing region 214 and various transistors (which can collectively be referred to as pixel circuitry) allow the sensor element 210 to detect the intensity of the particular light wavelength. Additional circuitry, inputs, and/or outputs may be provided for the sensor element 210 to provide an operation environment for the sensor element 210 and/or support communication with the sensor element 210.

The transfer gate 220 and the reset gate 222 are disposed over the front surface 204 of the substrate 202. The transfer gate 220 interposes a source/drain region 224 of the substrate 202 and the light-sensing region 214, such that a channel is defined between the source/drain region 224 and the light-sensing region 214. The reset gate 222 interposes two source/drain regions 224 of the substrate 202, such that a channel is defined between the two source/drain regions 224. In the depicted embodiment, the source/drain regions 224 are N+ source/drain diffusion regions. The source/drain regions 224 may be referred to as floating diffusion regions. The transfer gate 220 and reset gate 222 include a gate stack having a gate dielectric layer and a gate electrode. The gate dielectric layer includes a dielectric material, such as silicon oxide, a high-k dielectric material, other dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other high-k dielectric material, or combinations thereof. The gate electrode includes polysilicon and/or a metal including Al, Cu, Ti, Ta, W, Mo, TaN, NiSi, CoSi, TiN, WN, TiAl, TiAlN, TaCN, TaC, TaSiN, other conductive material, or combinations thereof. The gate stacks may include numerous other layers, for example, capping layers, interface layers, diffusion layers, barrier layers, or combinations thereof. The transfer gate 220 and reset gate 222 may include spacers disposed on the sidewalls of the gate stacks. The spacers include a dielectric material, such as silicon nitride, silicon oxynitride, other suitable material, or combinations thereof. The spacers may include a multi-layer structure, such as a multi-layer structure including a silicon nitride layer and a silicon oxide layer. The transfer gate 220 and the reset gate 222 are formed by a suitable process, including deposition, lithography patterning, and etching processes.

The integrated circuit device 200 further includes a multilayer interconnect (MLI) 230 disposed over the front surface 204 of the substrate 202, including over the sensor element 210. The MLI 230 is coupled to various components of the BSI image sensor device, such as the sensor element 210, such that the various components of the BSI image sensor device are operable to properly respond to illuminated light (imaging radiation). The MLI 230 includes various conductive features, which may be vertical interconnects, such as contacts 232 and/or vias 234, and/or horizontal interconnects, such as lines 236. The various conductive features 232, 234, and 236 include conductive materials, such as metals. In an example, metals including aluminum, aluminum/silicon/copper alloy, titanium, titanium nitride, tungsten, polysilicon, metal silicide, or combinations thereof, may be used. In some embodiments, the various conductive features 232, 234, and 236 may be referred to as aluminum interconnects. Aluminum interconnects may be formed by a process including physical vapor deposition (PVD), chemical vapor deposition (CVD), or combinations thereof. Other manufacturing techniques used to form the various conductive features 232, 234, and 236 may include photolithography processing and etching to pattern conductive materials to form the vertical and horizontal connects. Still other manufacturing processes may be implemented to form the MLI 230, such as a thermal annealing to form a metal silicide. The metal silicide used in multilayer interconnects may include nickel silicide, cobalt silicide, tungsten silicide, tantalum silicide, titanium silicide, platinum silicide, erbium silicide, palladium silicide, or combinations thereof. Alternatively, the various conductive features 232, 234, and 236 may be copper multilayer interconnects, which include copper, copper alloy, titanium, titanium nitride, tantalum, tantalum nitride, tungsten, polysilicon, metal silicide, or combinations thereof. The copper interconnects may be formed by a process including PVD, CVD, or combinations thereof. The MLI 230 is not limited by the number, material, size, and/or dimension of the conductive features 232, 234, 336 depicted, and thus, the MLI 230 may include any number, material, size, and/or dimension of conductive features depending on design requirements of the integrated circuit device 200.

The various conductive features 232, 234, and 236 of the MLI 230 are disposed in an interlayer (or inter-level) dielectric (ILD) layer 240. The ILD layer 240 may include silicon dioxide, silicon nitride, silicon oxynitride, tetraethyl orthosilicate (TEOS) oxide, phosphosilicate glass (PSG), borophosphosilicate glass (BPSG), fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK® (Dow Chemical, Midland, Mich.), polyimide, other suitable material, or combinations thereof. The ILD layer 240 may have a multilayer structure. The ILD layer 240 may be formed by a technique including spin-on coating, CVD, sputtering, or other suitable processes. In an example, the MLI 230 and ILD 240 may be formed in an integrated process including a damascene process, such as a dual damascene process or single damascene process.

A carrier wafer 250 is disposed over the front surface 204 of the substrate 202. In the depicted embodiment, the carrier wafer 250 is bonded to the MLI 230. The carrier wafer 250 includes silicon. Alternatively, the carrier wafer 250 includes another suitable material, such as glass. The carrier wafer 250 can provide protection for the various features (such as the sensor element 210) formed on the front surface 204 of the substrate 202, and can also provide mechanical strength and support for processing the back surface 206 of the substrate 202.

An optional doped layer 260 is disposed at the back surface 206 of the substrate 202. The doped layer 260 is formed by an implantation process, diffusion process, annealing process, other suitable processes, or combinations thereof. In the depicted embodiment, the doped layer 260 includes p-type dopants, such as boron, and may be a P+ doped layer. The doped layer 260 may include other p-type dopants, such as gallium, indium, other p-type dopants, or combinations thereof. Alternatively, the doped layer 260 includes n-type dopants, such as phosphorus, arsenic, other n-type dopants, or combinations thereof. The doped layer 260 has a dopant depth, d, that extends into the substrate 202 from the back surface 206 of the substrate 202. The dopant depth, dopant concentration, dopant profile, or combination thereof of the doped layer 260 may be selected to enhance image quality provided by the image sensor device of the integrated circuit device 200.

The integrated circuit device 200 further includes features disposed over the back surface 206 of the substrate 202. An antireflective film 270, a color filter 290, and a lens 295 are disposed over the back surface 206 of the substrate 202. In the depicted embodiment, the antireflective film 270 includes the metal oxide anti-reflection laminate and is disposed between the back surface 206 of the substrate 202 and the color filter 290.

Figure 3:
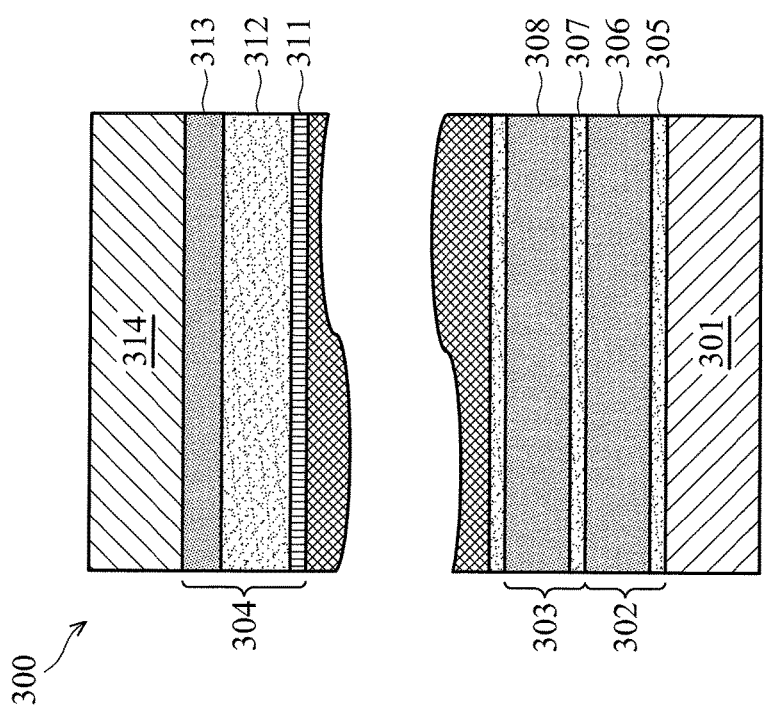
FIG. 3 is a partial diagrammatic cross-sectional view of the integrated circuit device including an antireflective film on an image sensor device according to various aspects of the present disclosure.

The anti-reflection film 270 includes one or more composite layers of thin metal oxides stacked over the photodiode over the back surface 206 of the substrate 202. FIG. 3 is a partial diagrammatic cross-sectional view of a metal oxide anti-reflection laminate 300 according to various aspects of the present disclosure. Each composite layer (302, 303, or 304) includes two or more metal oxide layers, for example, metal oxide layers 305 and 306 form composite layer 302, metal oxide layers 307 and 308 form composite layer 303, and metal oxide layers 311, 312, and 313 form composite layer 304. At least one metal oxide layer in a composite layer is a high energy band gap metal oxide. At least one metal oxide layer in the composite layer is a high refractive index metal oxide. For example, in composite layer 302, metal oxide layer 305 is a high energy band gap metal oxide and metal oxide layer 306 is a high refractive index metal oxide. In composite layers having more than 2 metal oxide layers, the additional metal oxide layer may be a high energy band gap metal oxide or a high refractive index metal oxide or a metal oxide having intermediate properties as to the energy band gap and the refractive index.

According to various embodiments, the high energy band gap metal oxide has a thickness between about 1-20 angstroms, about 5-10 angstroms, or about 10 angstroms. According to various embodiments, the high energy bad gap metal oxide is aluminum oxide, magnesium oxide, calcium oxide, hafnium oxide, zirconium oxide, or yttrium oxide and may be amorphous. According to various embodiments, the high refractive index metal oxide has a thickness between about 5-200 angstroms, about 20-100 angstroms, or about 50 angstroms. In some embodiments, the high energy band gap metal oxide has a thickness less than half that of the thickness of the high refractive index metal oxide. According to various embodiments, the high refractive index metal oxide is zirconium oxide, hafnium oxide, tantalum oxide, strontium oxide, titanium oxide, lanthanum oxide, or barium oxide and may be amorphous. While some metal oxides, such as zirconium oxide, exhibit high energy band gap and high refractive index and may be used as either type in a composite layer, within a single composite layer the metal oxides layers are different materials having different refractive indices. Generally, a high energy band gap metal oxide is a metal oxide that is a band gap of at least 6 electron volts. A high refractive index metal oxide is a metal oxide that has a refractive index of at least 2.0. In addition to the properties of band gap energy and refractive index, the metal oxide layers as formed have a compressive stress. The compressive stress improves adhesion during subsequent processing and use of the device. Further, the metal oxides have a negative charge at an interface with adjacent layers and in the metal oxide anti-reflection laminate 300 overall. The negative charge creates a depletion layer at or close to the metal oxide interface that reduces dark current (current that flows in the image sensor device in absence of incident light on the image sensor device) that can cause a white pixel (where an excessive amount of current leakage causes an abnormally high signal from the pixel).

Each composite layer may include metal oxide layers in any order, except for the composite layer closest to the back surface of the substrate. The composite layer closest to the back surface of the substrate, for example, composite layer 302, has the high energy band gap metal oxide layer closer to the back surface of the substrate and high refractive index metal oxide layer further away from the back surface of the substrate. Other composite layers may have the high energy band gap metal oxide layer further away from the back surface of the substrate and high refractive index metal oxide layer closer to the back surface of the substrate. In some embodiments, the composite layers are stacked in such a way so as to maximum the variance in refractive indices between adjacent layers with the metal oxide layer closest to the back surface of the substrate being a high energy band gap metal oxide layer.

Composite layers may be stacked a number of times until a total thickness of at least 100 Angstroms up to about 1000 Angstroms is reached. In some embodiments, the composite layers have a combined thickness of between about 300 to about 800 Angstroms. The stacking may include the same or different composite layers. For example, composite layers 302 and 303 may be identical, but composite layer 304 is different from compote layers 302 and 303. The thickness of the metal oxide layers in different composite layers may vary as well as the composition of the metal oxide layers. A metal oxide anti-reflection laminate may include tens or hundreds of composite layers, depending on the thickness of each layer and the total thickness of the metal oxide anti-reflection laminate. FIG. 3 includes a break in the metal oxide anti-reflection laminate 300 to illustrate that only a few composite layers are in the drawing.

An adhesion oxide layer 301 adheres to the back surface of the substrate. The adhesion oxide is a silicon oxide deposited using a plasma process or grown using a thermal process such as using a furnace. The adhesion oxide is 50 Angstroms or less. A buffer layer 314 may be used between the metal oxide anti-reflection laminate 300 and subsequent layers over the metal oxide anti-reflection laminate. The buffer layer may be a silicon oxide layer.

Referring back to FIG. 2, the color filter 290 is disposed over antireflective film 270 and is aligned with the light-sensing region 214 of the sensor element 210. The color filter 290 is designed to transmit light of a predetermined wavelength. For example, the color filter 290 may transmit visible light of a red wavelength, a green wavelength, or a blue wavelength to the sensor element 210. The color filter 290 includes any suitable material. In an example, the color filter 290 includes a dye-based (or pigment-based) polymer for filtering out a specific frequency band (for example, a desired wavelength of light). Alternatively, the color filter 290 includes a resin or other organic-based material having color pigments.

The lens 295, disposed over the back surface 206 of the substrate 202, particularly over the color filter 290, is also aligned with the light-sensing region 214 of the sensor element 210. The lens 295 may be in various positional arrangements with the sensor element 210 and color filter 290, such that the lens 295 focuses the incident radiation 212 on the light sensing region 214 of the sensor element 210. The lens 295 includes any suitable material, and may have a variety of shapes and sizes depending on an index of refraction of the material used for the lens and/or a distance between the lens and sensor element 210. Alternatively, the position of the color filter layer 290 and lens layer 295 may be reversed, such that the lens 295 is disposed between the antireflective film 270 and color filter 290. In some embodiments, integrated circuit device 200 has a color filter layer disposed between lens layers.

In operation, the integrated circuit device 200 is designed to receive radiation 212 traveling towards the back surface 206 of the substrate 202. The lens 295 directs the incident radiation 212 to the color filter 290. The light then passes from the color filter 290 through the antireflective film 270 to the substrate 202 and corresponding sensor element 210, specifically to the light sensing region 214. Light passing through to the color filter 290 and sensor element 210 may be maximized since the light is not obstructed by various device features (for example, gates electrodes) and/or metal features (for example, the conductive features 232, 234, and 236 of the MLI 230) overlying the front surface 204 of the substrate 202. The desired wavelength of light (for example, red, green, and blue light) that is incident on the light-sensing region 214 of the sensor element 210. When exposed to the light, the light-sensing region 214 of the sensor element 210 produces and accumulates (collects) electrons as long as the transfer transistor associated with transfer gate 220 is in an "off" state. When the transfer gate 220 is in an "on" state, the accumulated electrons (charge) can transfer to the source/drain regions (floating diffusion region) 224. A source-follower transistor (not illustrated) may convert the charge to voltage signals. Prior to charge transfer, the source/drain regions 224 may be set to a predetermined voltage by turning on the reset transistor associated with reset gate 222. In an example, the pinned layer 216 and the doped layer 260 may have a same potential, such as a potential of the substrate 202, such that the light-sensing region 214 is fully depleted at a pinning voltage ($V_{PIN}$) and a potential of the sensor element 210 is pinned to a constant value, $V_{PIN}$, when the light-sensing region 214 is fully depleted.

Figure 4A:
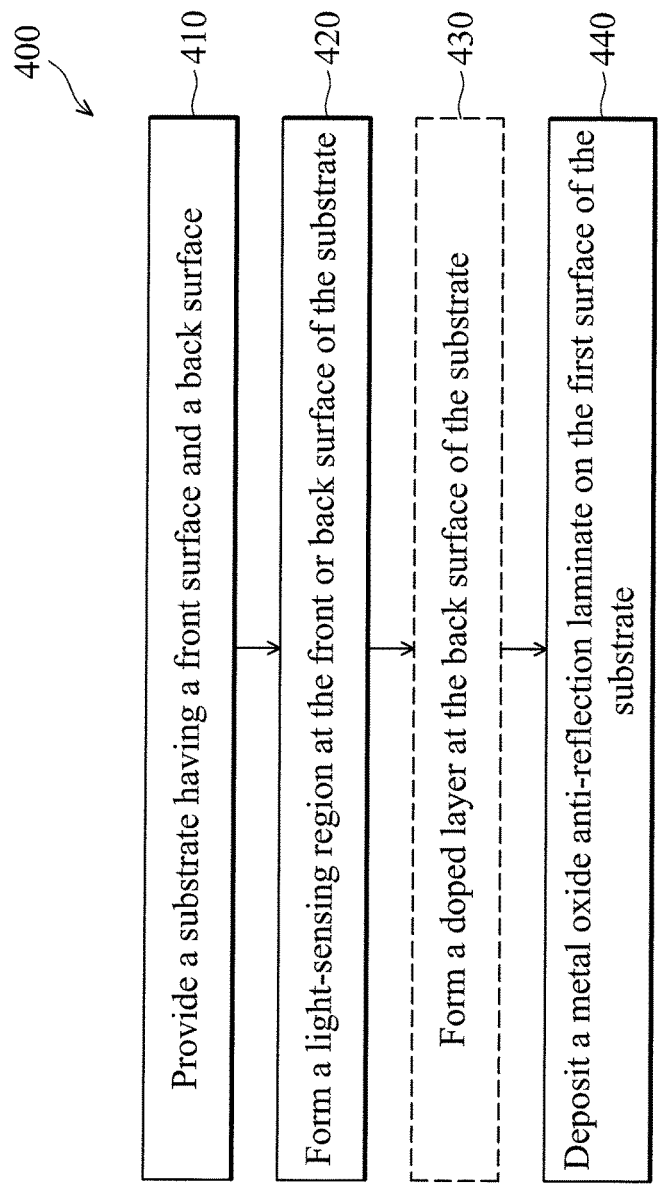
FIGS. 4A and 4B are flow charts of a method for fabricating an integrated circuit device including an image sensor device according to various aspects of the present disclosure.
Figure 4B:
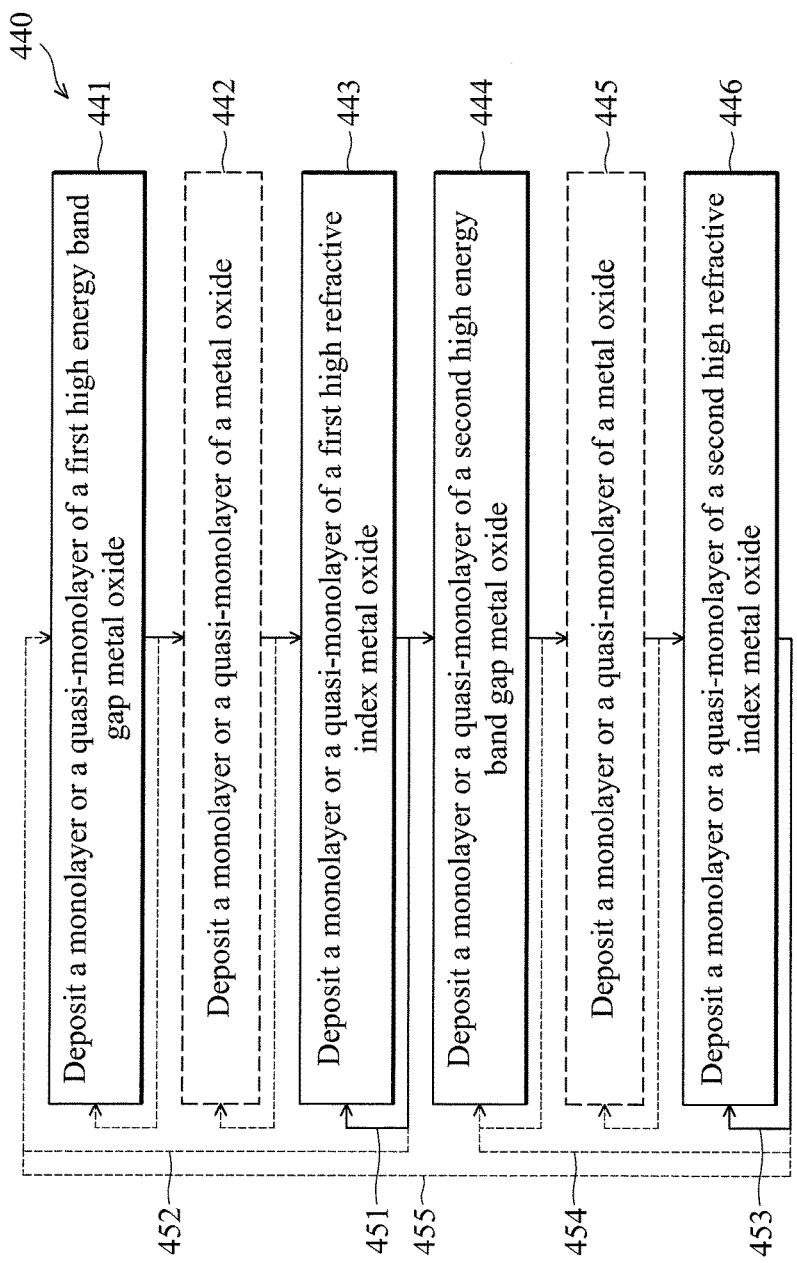

FIGS. 4A and 4B are flow charts of a method 400 for fabricating an integrated circuit device including an image sensor device according to various aspects of the present disclosure. In FIG. 4A, the method 400 begins at block 410 where a substrate having a front surface and a back surface, or a first surface and a second surface, is provided. In various embodiments, the front surface is the second surface and the back surface is the first surface. The substrate is a semiconductor substrate including silicon and may include a doped epi layer, a gradient semiconductor layer, and/or a semiconductor layer overlying another semiconductor layer of a different type, such as a silicon layer on a silicon germanium layer. In some embodiments, the substrate is a p-type substrate doped with boron, gallium, indium, other suitable p-type dopants, or combinations thereof.

At block 420, a light-sensing region is formed at one of the surfaces of the substrate, which is usually the front surface where a majority of the semiconductor processing takes place. Various portions of the image sensor device such as metal interconnect structure and other devices such as transistors in addition to the light-sensing region are formed at the front surface. The substrate is thinned from the back surface after the image sensor device formation.

At optional block 430, a doped layer is formed at the back surface of the substrate. In an example, forming the doped layer includes performing an ion implantation process to implant dopants at the back surface of the substrate, performing an annealing process, such as a laser annealing process, to activate the implanted dopants, and polishing the back surface.

At block 440, a metal oxide anti-reflection laminate is deposited on the back surface of the substrate.

FIG. 4B provides detailed flow of the operations of block 440 in FIG. 4A according to various embodiments. The metal oxide anti-reflection laminate is deposited in multiple operations for each composite layer and each metal oxide layer within each composite layer. The deposition of each metal oxide layer is performed using various chemical vapor deposition (CVD) processes known in the art and repeated multiple times to reach a desired total thickness and number of metal oxide layers and composite layers. The CVD process may be a plasma enhanced chemical vapor deposition (PECVD), a low pressure chemical vapor deposition (LPCVD), an atomic layer deposition (ALD).

In some embodiments, the metal oxide layers of the metal oxide anti-reflection laminate are formed by an ALD method. The ALD method is based on the sequential use of a gas phase chemical process. The majority of ALD reactions use two chemicals, typically called precursors. These precursors react with a surface one-at-a-time in a sequential manner. In a first operation, the surface is exposed to a first precursor, which adsorbs onto the surface. The first precursor gas is then purged from the reaction chamber, usually by vacuum suction and optionally adding a purge gas such as nitrogen. The surface is then exposed to a second precursor, which reacts with the first precursor that is adsorbed on the surface. The reaction creates a monolayer or a quasi-monolayer of a reaction product. The reaction chamber is again purged of the second precursor, leaving a thin layer of metal oxide reaction product, between about 1 Angstrom to about 5 Angstroms thick, on the surface. By exposing the precursors to the substrate surface repeatedly, a metal oxide layer is deposited. The ALD method provides a uniform thickness of the metal oxide layers with high quality. A subsequent metal oxide layer may be deposited over the substrate by changing at least one of the precursor gases without moving the substrate to another reaction chamber. Thus, the entire metal oxide anti-reflection laminate may be deposited in one ALD chamber.

A variation of the ALD method that involves using a radio frequency (RF) plasma to activate the reaction between the precursors is Plasma Enhanced ALD (PEALD). Because the precursors do not react during gas phase, the purge operations may be omitted, resulting in a faster cycle time for each monolayer or quasi-monolayer and better overall throughput. As compared to ALD methods using a thermally activated reaction, the substrate temperature is lower during PEALD. Because the metal oxide anti-reflection laminate deposition occurs toward the end of the device manufacture when a thermal budget is low, use of the thermally activated reaction may be limited by the thermal budget. Various precursor gases are available commercially and are created to deposit metal oxides using the ALD methods.

In block 441 of FIG. 4B, a monolayer or a quasi-monolayer of a first high energy band gap metal oxide is deposited on the backside of the substrate. Depending on the overall thickness defined for the first metal oxide layer of the first composite layer, block 441 may be repeated as necessary to obtain the defined thickness. The monolayer or quasi-monolayer may be deposited using ALD, which may involve a plasma activated reaction or a thermally activated reaction.

In optional block 442, a monolayer or a quasi-monolayer of a metal oxide is deposited over the first high energy band gap metal oxide of block 441. The metal oxide deposited in block 442 is a different material from the first high energy band gap metal oxide of block 441. Block 442 may also be repeated as necessary to obtain a desired thickness of the metal oxide.

In block 443, a monolayer or a quasi-monolayer of a first high refractive index metal oxide is deposited. The monolayer or quasi-monolayer deposited in block 443 is stacked by repeating block 443 using a loop 451 until a desired thickness is obtained. In some embodiments, tens or hundreds of deposition cycles are used.

Blocks 441, 442, and 443 form a first composite layer having two metal oxide layers (blocks 441 and 443) or three metal oxide layers (blocks 441, 442, and 443). If more than three metal oxide layers are used in one composite layer, more deposition blocks are inserted. The composite layer may be repeatedly stacked by following loop 452 back to block 441, where the entire composite layer is repeated. In some embodiments, the composite layer deposition is repeated with identical operations. In other embodiments, the composite layer is repeated with different thicknesses in the individual metal layers.

In block 444, a monolayer or a quasi-monolayer of a second high energy band gap metal oxide is deposited on the backside of the substrate. Block 444 may be repeated as necessary to obtain a desired thickness.

In optional block 445, a monolayer or a quasi-monolayer of a metal oxide is deposited over the first high energy band gap metal oxide of block 444. The metal oxide deposited in block 445 is a different material from the first high energy band gap metal oxide of block 444. Block 445 may also be repeated as necessary to obtain a defined thickness of the metal oxide.

In block 446, a monolayer or a quasi-monolayer of a second high refractive index metal oxide is deposited. The monolayer or quasi-monolayer deposited in block 446 is stacked by repeating block 446 using a loop 453 until a defined thickness is obtained. In some embodiments, tens or hundreds of deposition cycles are used. While FIG. 4B shows that the second high energy band gap metal oxide is deposited before the second high refractive index metal oxide, blocks 444, 445, 446 need not occur in any particular order.

Blocks 444, 445, and 446 form a second composite layer having two metal oxide layers (blocks 444 and 446) or three metal oxide layers (blocks 444, 445, and 446). The second composite layer is different from the composite layer of blocks 441, 442, and 443. In some embodiments, the second composite layer includes different materials than the first composite layer. In some embodiments, the second composite layer includes at least one different thickness than the first composite layer. In some embodiments, the second composite layer includes a different sequence of layers than the first composite layer. The second composite layer may be repeatedly stacked by following loop 454 back to block 444, where the entire second composite layer is repeated. Additionally, loop 455 may be used to repeat both the first composite layer and the second composite layer.

The present disclosure provides for many different embodiments of methods and device. For example, a method of forming an image sensor device includes forming a light sensing region at a surface of a silicon substrate and a patterned metal layer there over. Thereafter, the method includes depositing a metal oxide anti-reflection laminate on the first surface of the substrate.

Embodiments of semiconductor device includes a semiconductor substrate having a first surface and a second surface opposed to the first surface, a metal oxide anti-reflection laminate over the first surface of the semiconductor substrate, an interconnect structure on the second surface of the semiconductor, a plurality of photodiodes in the semiconductor substrate between the metal oxide anti-reflection laminate and the interconnect structure, and a -lens over the metal oxide-anti-reflection laminate corresponding to one or more of the plurality of photodiodes. The metal oxide anti-reflection laminate comprises at least one metal oxide pair including a high energy band gap metal oxide and a high refractive index metal oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a semiconductor substrate having a first surface and a second surface opposed to the first surface;
a metal oxide anti-reflection laminate over the first surface of the semiconductor substrate;
an interconnect structure on the second surface of the semiconductor substrate;
a plurality of photodiodes in the semiconductor substrate between the metal oxide anti-reflection laminate and the interconnect structure; and
a lens over the metal oxide anti-reflection laminate corresponding to one or more of the plurality of photodiodes,
wherein
the metal oxide anti-reflection laminate comprises a plurality of metal oxide pairs respectively having a compressive stress configured to improve adhesion of the metal oxide anti-reflection laminate to the semiconductor substrate,
each metal oxide pair of the plurality of metal oxide pairs includes a high energy band gap metal oxide consisting of aluminum oxide, magnesium oxide, calcium oxide, hafnium oxide, or yttrium oxide, and a high refractive index metal oxide consisting of strontium oxide, lanthanum oxide, or barium oxide,
the high refractive index metal oxide within each of the plurality of metal oxide pairs comprises a same material continuously extending between opposing surfaces that directly contact high energy band gap metal oxides consisting of aluminum oxide, magnesium oxide, calcium oxide, hafnium oxide, or yttrium oxide,
the metal oxide anti-reflection laminate has a negative charge at an interface between adjacent metal oxide layers and overall, and
the negative charge is configured to form a depletion layer at the interface.

2. The semiconductor device of claim 1, wherein the high energy band gap metal oxide in a first metal oxide pair of the plurality of metal oxide pairs is closer to the first surface of the semiconductor substrate than the high refractive index metal oxide in the first metal oxide pair of the plurality of metal oxide pairs is to the semiconductor substrate.

3. The semiconductor device of claim 1, wherein a high refractive index metal oxide layer within the metal oxide anti-reflection laminate has a first side contacting a high energy band gap metal oxide layer and a second side contacting a buffer layer over the metal oxide anti-reflection laminate.

4. The semiconductor device of claim 1, wherein the high energy band gap metal oxide is yttrium oxide.

5. The semiconductor device of claim 1, wherein the high energy band gap metal oxide within each metal oxide pair of the plurality of metal oxide pairs has a thickness less than half that of a thickness of the high refractive index metal oxide within each metal oxide pair of the plurality of metal oxide pairs.

6. The semiconductor device of claim 1, wherein at least one high energy band gap metal oxide of the plurality of metal oxide pairs has a band gap that is different from at least one other high energy band gap metal oxide of the plurality of metal oxide pairs.

7. The semiconductor device of claim 1, wherein the metal oxide anti-reflection laminate comprises an outermost high refractive index metal oxide arranged along an outermost surface of the metal oxide anti-reflection laminate facing away from the semiconductor substrate.

8. The semiconductor device of claim 1, wherein each metal oxide pair of the plurality of metal oxide pairs consists of the high energy band gap metal oxide and the high refractive index metal oxide.

9. The semiconductor device of claim 8, wherein the metal oxide anti-reflection laminate comprises a first composite layer and a second composite layer, and wherein the first composite layer has a high refractive index metal oxide along an outermost surface of the first composite layer facing away from the semiconductor substrate, and wherein the second composite layer has a high energy band gap metal oxide along an outermost surface of the second composite layer facing away from the semiconductor substrate.

10. A semiconductor device comprising:
a semiconductor substrate having a first surface and a second surface opposed to the first surface, wherein the semiconductor substrate has a p-type dopant;
a metal oxide anti-reflection laminate contacting the first surface of the semiconductor substrate, wherein the metal oxide anti-reflection laminate comprises an outermost high refractive index metal oxide arranged along an outermost surface of the metal oxide anti-reflection laminate facing away from the semiconductor substrate;
a lens over the metal oxide anti-reflection laminate corresponding to one or more of a plurality of photodiodes;
an impurity layer comprising a p+ doped layer that is arranged within the semiconductor substrate, wherein the impurity layer continuously extends from the first surface of the semiconductor substrate facing the metal oxide anti-reflection laminate to a lowermost boundary that is confined between the plurality of photodiodes and the first surface of the semiconductor substrate; and
an interconnect structure on the second surface of the semiconductor substrate,
wherein
the plurality of photodiodes are in the semiconductor substrate between the metal oxide anti-reflection laminate and the interconnect structure,
the metal oxide anti-reflection laminate comprises at least two metal oxide composite layers,
each metal oxide composite layer of the at least two metal oxide composite layers comprises a high refractive index metal oxide layer and a high energy band gap metal oxide layer, wherein the high energy band gap metal oxide layer consists of aluminum oxide, magnesium oxide, calcium oxide, hafnium oxide, or yttrium oxide,
the high refractive index metal oxide layer within the at least two metal oxide composite layers comprises a same material continuously extending between opposing surfaces that directly contact high energy band gap metal oxide layers consisting of aluminum oxide, magnesium oxide, calcium oxide, hafnium oxide, or yttrium oxide,
at least one of the at least two metal oxide composite layers comprises an amorphous material;
the metal oxide anti-reflection laminate has a negative charge at an interface between adjacent metal oxide layers and overall; and
the negative charge is configured to form a depletion layer at the interface.

11. A semiconductor device comprising:
a substrate;

a photo-sensing element in the substrate;
an adhesion layer physically contacting the substrate;
an antireflective coating over a light-receiving surface of the substrate, wherein the antireflective coating comprises:
  a first composite layer comprising a first high energy band gap metal oxide layer and a first high refractive index metal oxide layer, wherein the first high energy band gap metal oxide layer has a first surface physically contacting the adhesion layer and a second surface physically contacting a first surface of the first high refractive index metal oxide layer; and
  a second composite layer comprising a second high energy band gap metal oxide layer and a second high refractive index metal oxide layer, wherein the second high refractive index metal oxide layer has a first surface physically contacting a second surface of the first high refractive index metal oxide layer and a second surface physically contacting a first surface of the second high energy band gap metal oxide layer,
wherein the first high refractive index metal oxide layer comprises a first material continuously extending between the first surface and the second surface of the first high refractive index metal oxide layer and the second high refractive index metal oxide layer comprises a second material continuously extending between the first surface and the second surface of the second high refractive index metal oxide layer; and
wherein the first high energy band gap metal oxide layer and the second high energy band gap metal oxide layer consist of aluminum oxide, magnesium oxide, calcium oxide, hafnium oxide, or yttrium oxide; and
an impurity layer arranged within the substrate, wherein the impurity layer continuously extends from the light receiving surface of the substrate facing the antireflective coating to a lowermost boundary that is confined between the photo-sensing element and the light receiving surface of the substrate.

12. The semiconductor device of claim 11, wherein the first high energy band gap metal oxide layer is between the substrate and the first high refractive index metal oxide layer.

13. The semiconductor device of claim 11, wherein the first composite layer is between the second composite layer and the substrate, and the first high refractive index metal oxide layer is between the second high refractive index metal oxide layer and the first high energy band gap metal oxide layer.

14. The semiconductor device of claim 11, further comprising:
  a third composite layer comprising a third high energy band gap metal oxide layer and a third high refractive index metal oxide layer,
  wherein an order of the third metal oxide layers in the third composite layer is different from the order of layers of at least one of the first metal oxide layers in the first composite layer or the second metal oxide layers in the second composite layer.

15. The semiconductor device of claim 11, wherein a thickness of the first high energy band gap metal oxide layer is less than half of a thickness of the first high refractive index metal oxide layer.

16. The semiconductor device of claim 11, wherein the first high energy band gap metal oxide layer has an amorphous structure.

17. The semiconductor device of claim 11, wherein an interface between the first high energy band gap metal oxide layer and the first high refractive index metal oxide layer has a negative charge.

18. The semiconductor device of claim 11, further comprising:
  a third composite layer comprising a third high energy band gap metal oxide, third high refractive index metal oxide, and an additional metal oxide having an energy band gap larger than an energy band gap of the third high refractive index metal oxide and smaller than an energy band gap of the third high energy band gap metal oxide.

19. The semiconductor device of claim 11,
  wherein the first high energy band gap metal oxide layer and the second high energy band gap metal oxide layer are aluminum oxide; and
  wherein the first high refractive index metal oxide layer and the second high refractive index metal oxide layer are hafnium oxide.

20. The semiconductor device of claim 11, wherein the first high refractive index metal oxide layer and the second high refractive index metal oxide layer are different materials.

* * * * *